(12) United States Patent
Park et al.

(10) Patent No.: US 11,508,690 B2
(45) Date of Patent: Nov. 22, 2022

(54) LASER COMPRESSION BONDING DEVICE AND METHOD FOR SEMICONDUCTOR CHIP

(71) Applicant: MI EQUIPMENT KOREA CO., LTD, Gyeonggi-do (KR)

(72) Inventors: Jae Shin Park, Daejeon (KR); Kuang Eng Oh, Bayan Lepas Penang (MY)

(73) Assignee: ML EQUIPMENT KOREA CO., LTD, Gyeonggi-Do (KR)

( * ) Notice: Subject to any disclaimer, the term of this patent is extended or adjusted under 35 U.S.C. 154(b) by 256 days.

(21) Appl. No.: 17/086,698

(22) Filed: Nov. 2, 2020

(65) Prior Publication Data
US 2022/0020718 A1   Jan. 20, 2022

(30) Foreign Application Priority Data

Jul. 14, 2020  (KR) .................. 10-2020-0087077

(51) Int. Cl.
*H01L 23/00* (2006.01)
*B23K 26/20* (2014.01)
*B23K 101/40* (2006.01)

(52) U.S. Cl.
CPC .............. *H01L 24/75* (2013.01); *B23K 26/20* (2013.01); *B23K 2101/40* (2018.08)

(58) Field of Classification Search
CPC ...... H01L 24/75; B23K 26/20; B23K 2101/40
See application file for complete search history.

(56) References Cited

FOREIGN PATENT DOCUMENTS

| KR | 10-1143838 B1 | 5/2012 |
| KR | 10-2014-0094086 A | 7/2014 |
| KR | 10-1416820 B1 | 7/2014 |
| KR | 10-1785092 B1 | 10/2017 |

*Primary Examiner* — Robert G Bachner
(74) *Attorney, Agent, or Firm* — Hamre, Schumann, Mueller & Larson, P.C.

(57) ABSTRACT

A laser compression bonding device and method for a semiconductor chip are proposed. The device includes a conveyor unit that transports a semiconductor chip and a substrate, and a bonding head that includes a bonding tool for applying a pressure to the chip and substrate, a laser beam generator for emitting a laser beam, a thermal imaging camera for measuring temperatures of the surfaces of semiconductor chip and substrate, and a compression unit for controlling a pressure applied by the bonding tool and a position thereof, wherein the compression unit includes a mount on which the bonding tool is detachably mounted, and a servo motor and a load cell that apply a pressure to the mount or control a position thereof. The servo motor is controlled with two values for pressure application and positioning.

4 Claims, 9 Drawing Sheets

[Fig. 1]
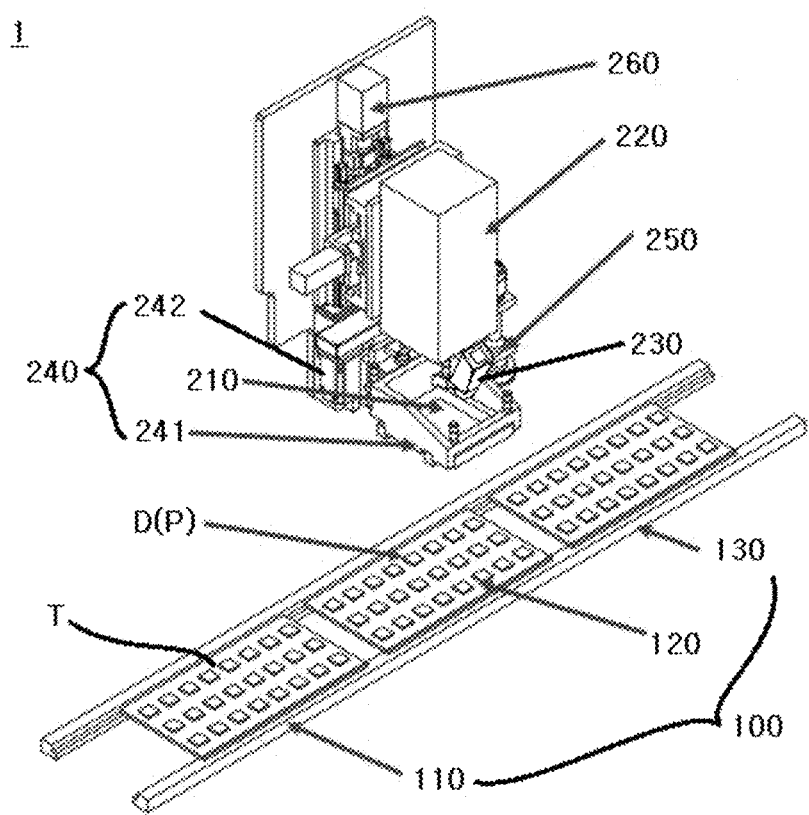

[Fig. 2]
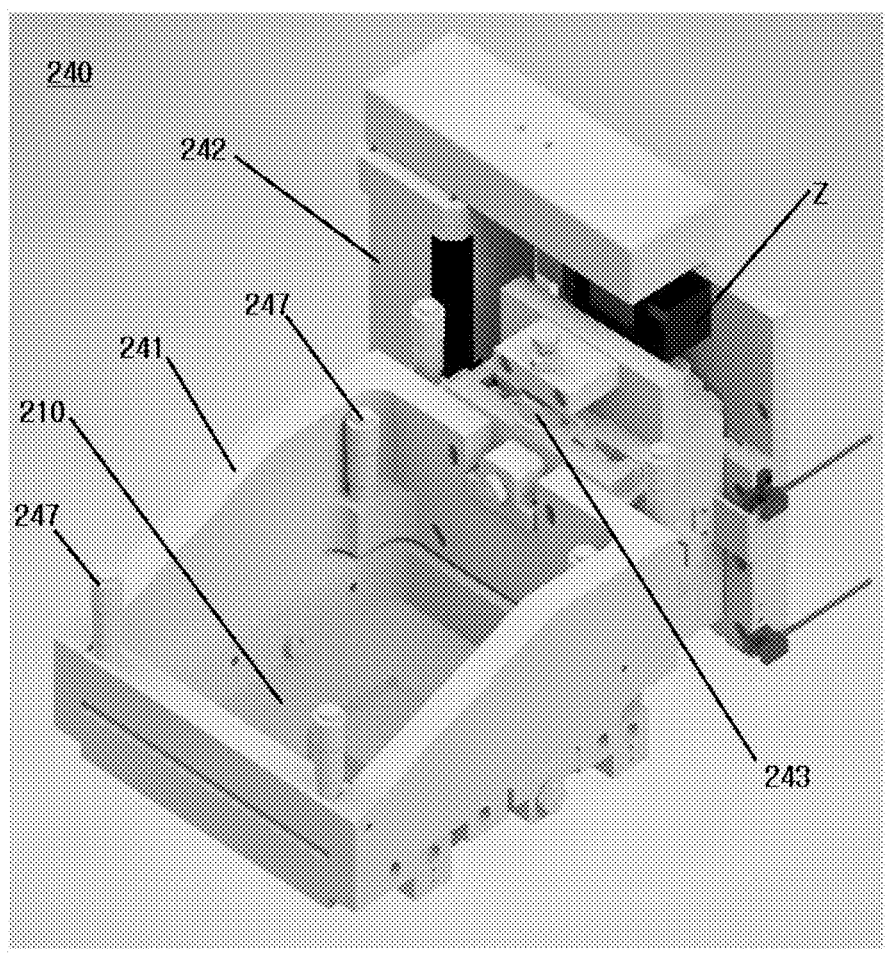

[Fig. 3]
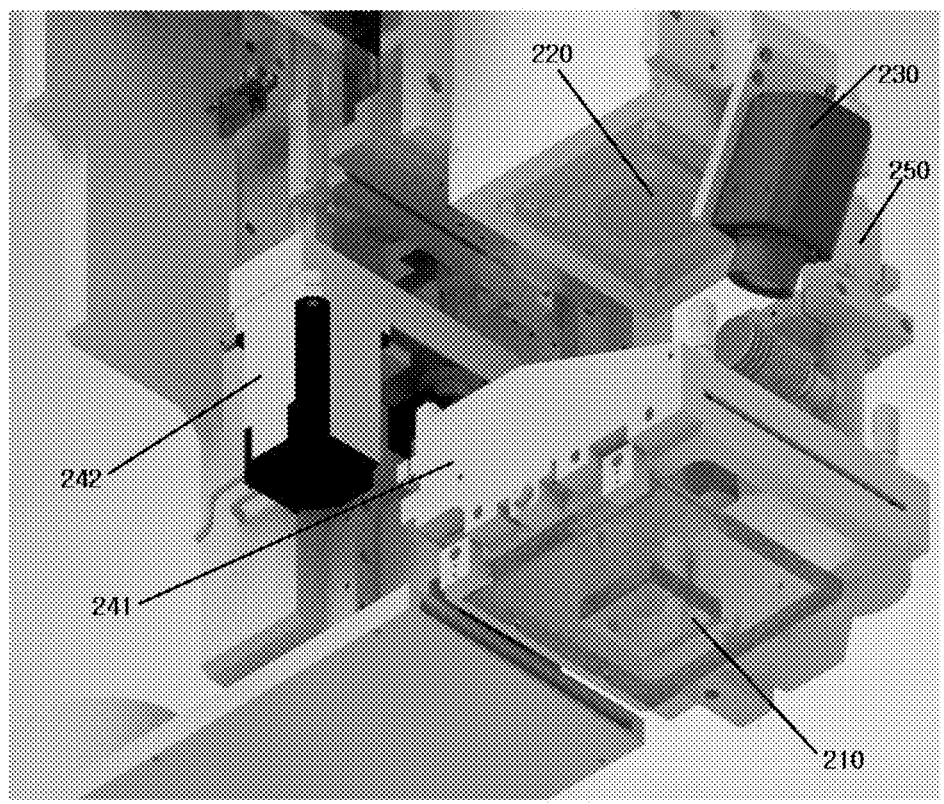

[Fig. 4]
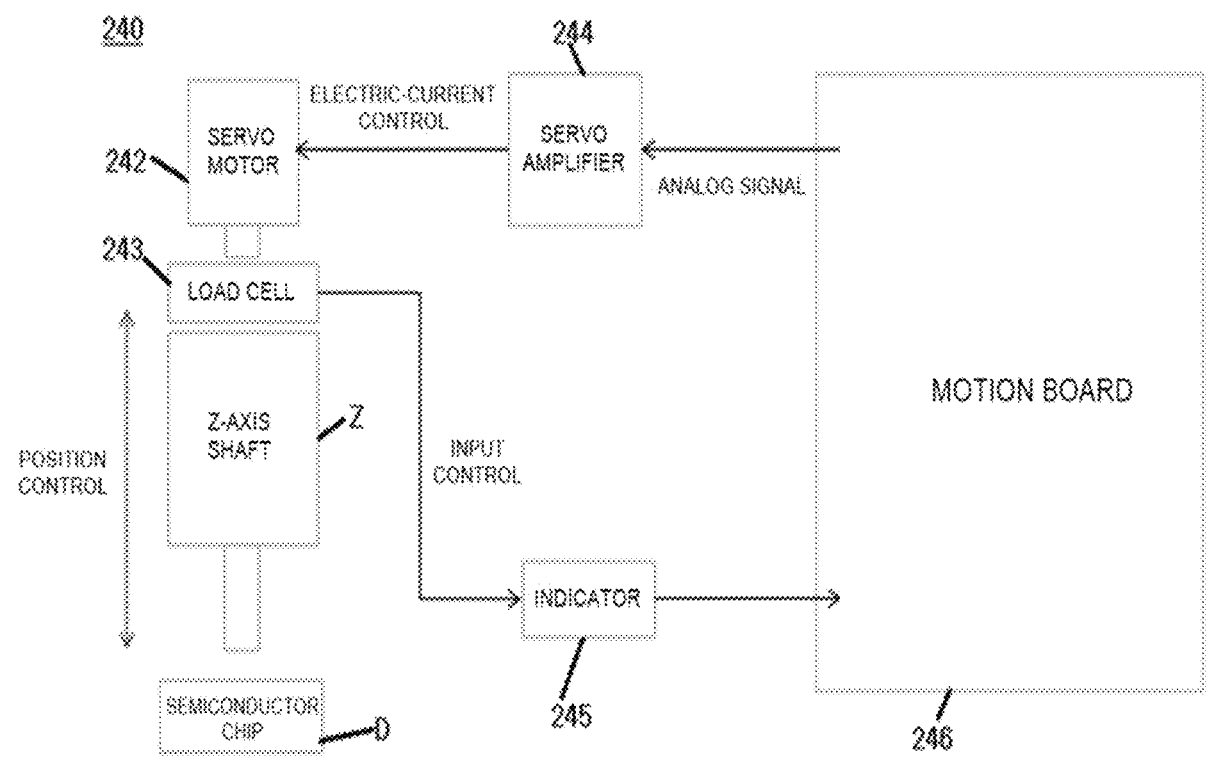

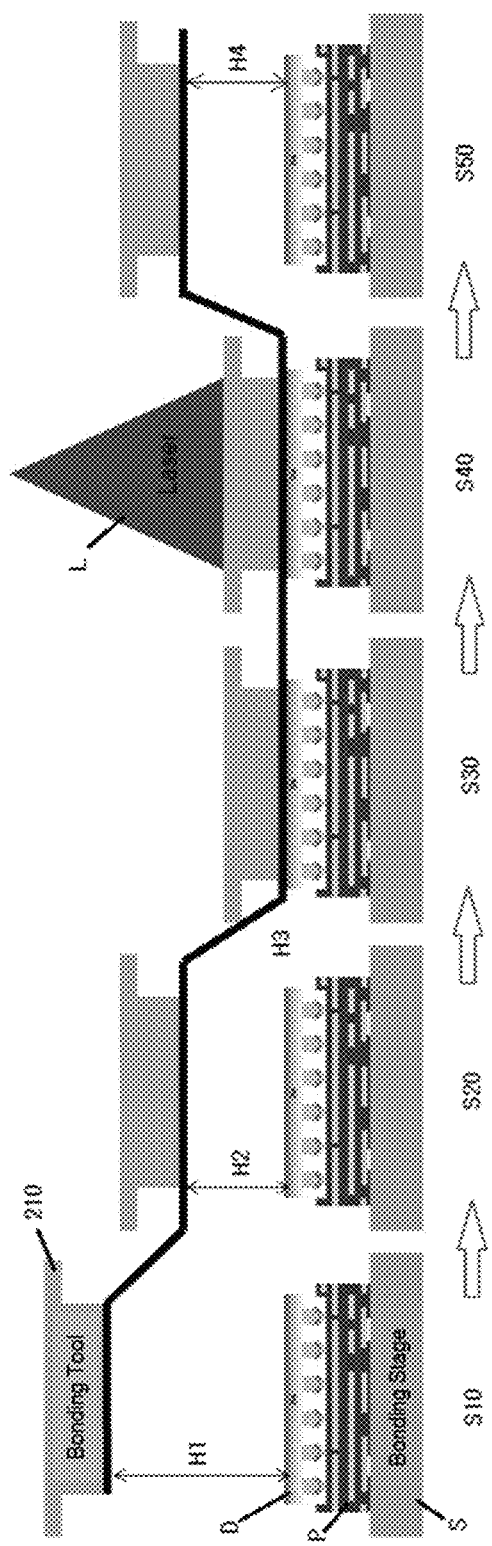
[Fig. 5]

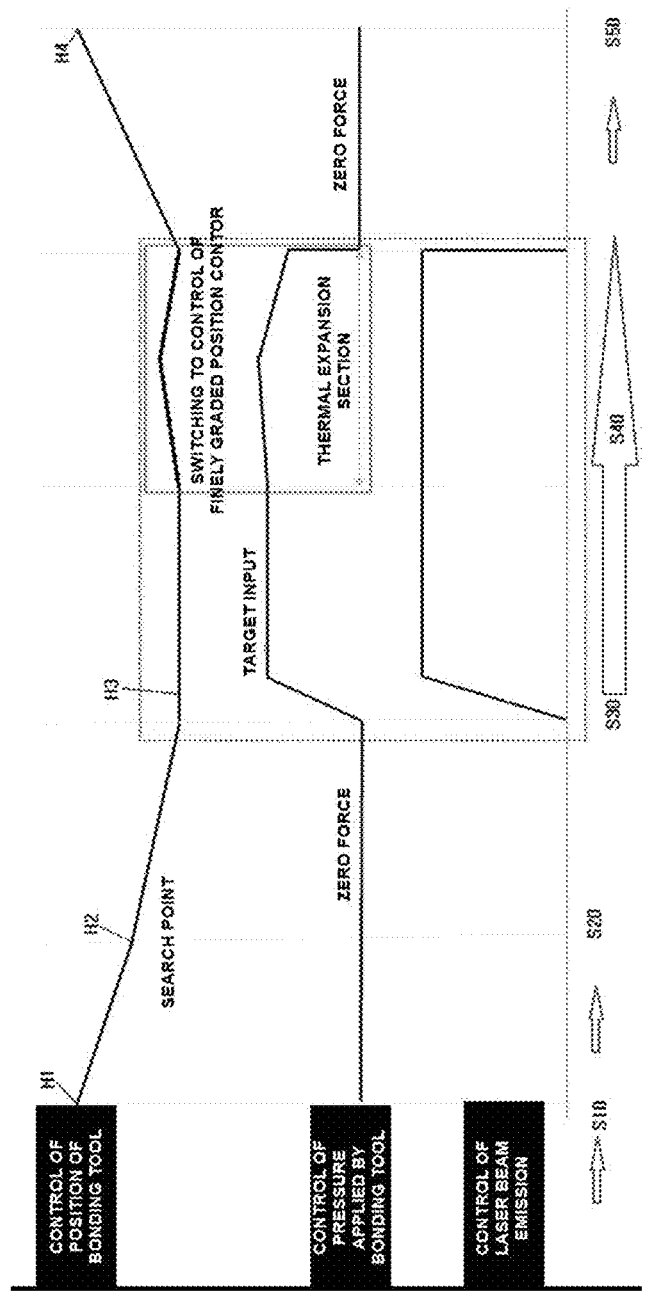
[Fig. 6]

[Fig. 7]
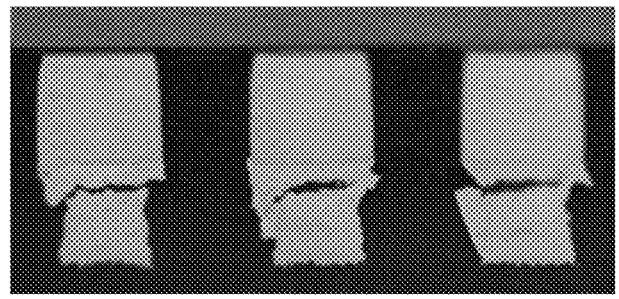
[Fig. 8]
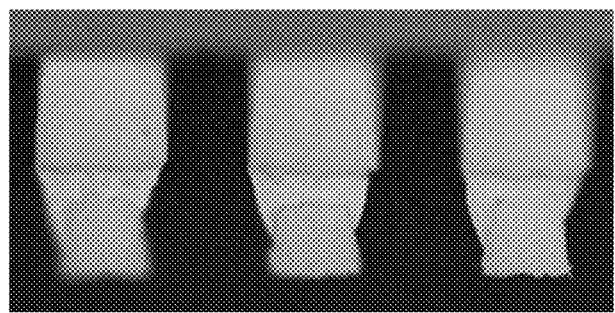

[Fig. 9]
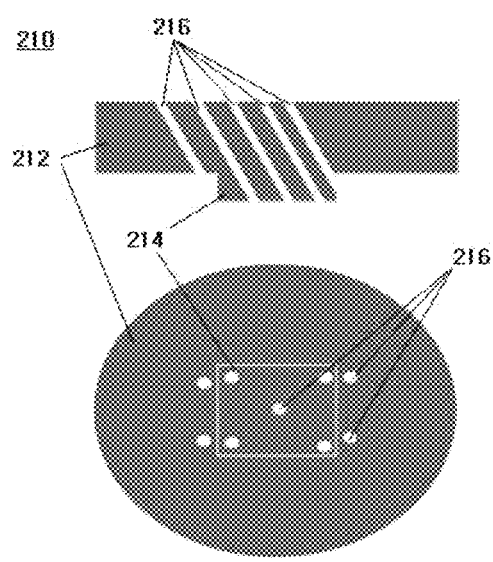

[Fig. 10]
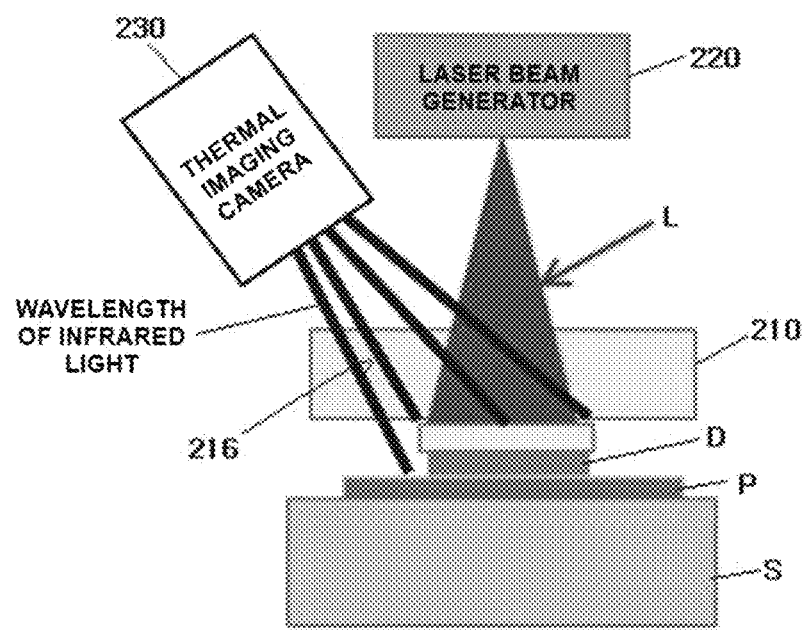

LASER COMPRESSION BONDING DEVICE AND METHOD FOR SEMICONDUCTOR CHIP

CROSS REFERENCE TO RELATED APPLICATION

The present application claims priority to Korean Patent Application No. 10-2020-0087077, filed Jul. 14, 2020, the entire contents of which is incorporated herein for all purposes by this reference.

BACKGROUND OF THE INVENTION

Field of the Invention

The present invention relates to a laser compression bonding device for and a laser compression bonding method of bonding a semiconductor chip of size 100 micrometers or less to a substrate, and more particularly, to a laser compression bonding device for and a laser compression bonding method of bonding a semiconductor chip to a substrate while warping of the semiconductor chip and the substrate that occurs when performing laser bonding is suppressed effectively through control of a pressure applied by a bonding tool and control of a position thereof.

Description of the Related Art

Generally, a flip chip bonding process is performed by causing a bump structure called a lead-free solder or Cu pillar to experience convection reflow. When a substrate and a semiconductor chip are heated at the same time due to a reflow-type structure, an expected problem occurs. That is, when the substrate is heated and thus expanded, due to a difference in a thermal expansion coefficient between the semiconductor chip and the substrate, a phenomenon appears where a bump or a microcircuit layer of the semiconductor chip is damaged and where bonding is thus improperly performed.

If any one of several thousands of bumps is damaged, a problem may occur in terms of a package function. Therefore, many efforts have been made to prevent the bump from being damaged while experiencing the reflow.

In order to solve this problem, studies have been made on a laser-assisted bonding technology. Generally, it takes approximately 5 to 7 minutes for the bump to experience the reflow. In contrast, during laser-assisted bonding that utilizes a laser technology, only a chip is heated for bonding for a very short time of 1 to 2 seconds per one region. Therefore, only the semiconductor chip and the vicinity thereof maintain a high temperature, and temperatures of other regions are relatively low. The semiconductor chip and the bump are partly exposed to heat for a short time, and thus thermal stresses thereto are relatively low. In addition, laser bonding requires such a small space that an installation cost for the laser bonding is approximately one seventh of that for existing convection reflow, which is very low. Furthermore, the laser bonding does not need $N_2$ gas. Thus, the laser bonding has an advantage in terms of space utilization.

For the latest integration of semiconductor ICs and diversification of functions thereof, a maximum number of bump pads need to be formed within one semiconductor chip. For this reason, a pitch between bump pads is decreased. In accordance with the trend toward weight reduction and function diversification, the substrate and the semiconductor chip also have undergone modifications and improvements, and currently a film-type substrate is utilized. Thus, a bonding area is increased while the thickness of a chip is decreased suitably for high-density mounting. A ratio for 2.5D or 3D package application is also increased.

In this state-of-the-art process, a substrate and a chip are placed under large thermal stress. However, a problem of the thermal stress is not easy to solve with an existing laser bonding/soldering technique.

The foregoing is intended merely to aid in the understanding of the background of the present invention and is not intended to mean that the present invention falls within the purview of the related art that is already known to those skilled in the art.

DOCUMENTS OF RELATED ART (Patent Document 1) Korean Patent No. 10-1785092 (registered on Sep. 28, 2017)
(Patent Document 2) Korean Patent Application Publication No. 10-2014-0094086 (published on Jul. 30, 2014)
(Patent Document 3) Korean Patent No. 10-1416820 (registered on Jul. 2, 2014)
(Patent Document 4) Korean Patent No. 10-1143838 (registered on Apr. 24, 2012)

SUMMARY OF THE INVENTION

An objective of the present invention, which was conceived to solve the problem described above, is to provide a laser compression bonding device and a laser compression bonding method that are capable of preventing a bonding defect (a non-wet phenomenon) due to warping of a semiconductor chip and a substrate that is caused by a difference in a thermal expansion coefficient between materials and thermal stress. This warping is a disadvantage with a laser bonding method.

Another objective of the present invention is to realize two solutions for performing bonding under a pressing condition and a non-pressing condition in one device according to a requirement during a bonding process and thus improving productivity.

Still another objective of the present invention is to provide a laser compression bonding method that is capable of preventing a material from being warped and thus solving a problem of a bonding defect by performing pressure control and position control under a pressing condition.

Still another objective of the present invention is to provide a laser compression bonding method that is capable of monitoring a temperature through a path for a thermal imaging camera, which is formed in an existing bonding tool made of quartz, and thus avoiding interference of a thermal wavelength toward the thermal imaging camera.

In order to achieve the objectives described above, according to an aspect of the present invention, there is provided a laser compression bonding device for a semiconductor chip, the device including: a conveyor unit configured to transport a semiconductor chip and a substrate which are received in a pre-bonding zone and on which bonding is then performed in a main bonding zone, to an unloading zone; and a bonding head that includes: a bonding tool configured to apply a pressure to the semiconductor chip and the substrate; a laser beam generator installed over the bonding tool and configured to emit a laser beam for bonding between the semiconductor chip and the substrate, the laser beam passing through the bonding tool; a thermal imaging camera configured to measure a temperature of each of the surfaces of the semiconductor chip and the substrate; and a compression unit configured to control a pressure applied by the bonding tool and a position thereof, in which the compression unit includes a mount on which the bonding tool is detachably mounted; and a servo motor and a load cell, which are configured to apply a pressure to the mount in the Z-axis direction or control a position thereof in a finely graded manner, and the servo motor is controlled with two target values for pressure application and positioning.

In the laser compression bonding device, the bonding tool, which is made of quartz, may have a manifold block in an upper portion thereof and an attachment in a lower portion thereof, the manifold block and the attachment being integrated into one piece, an image capture path may be formed to pass through the bonding tool in an inclined direction in such a manner as to allow a thermal wavelength toward the thermal imaging camera to pass along the image capture path, the image capture path being inclined at the same angle as the thermal imaging camera, and the laser beam generator may emit a laser beam, and then the thermal imaging camera may read a result of monitoring the temperature of each of the surfaces of the semiconductor chip and the substrate.

According to another aspect of the present invention, there is provided a laser compression bonding method of bonding a semiconductor chip to a substrate using the laser compression bonding device described above, the method including: moving down a bonding tool at a high speed from an initial position to a predetermined height for low-speed start-up; moving down the bonding tool at a low speed from the height for low-speed start-up to a height for lowest-speed start-up; moving down the bonding tool at a lowest speed from the height for lowest-speed start-up to a height for contact with a semiconductor chip D; determining that the bonding tool is brought into contact with the semiconductor chip D, when the bonding tool is moved down at the lowest speed to the height for contact with the semiconductor chip D and then a load cell detects that a pressure against the semiconductor chip D reaches 5 N/cm$^2$, and enabling a laser beam generator to operate to emit a laser beam, thereby performing bonding, when a target input value necessary for bonding at a pressure of 5 N/cm$^2$ is input; and moving up the bonding tool to a height for finishing a bonding operation, thereby finishing the bonding operation, when the bonding is finished, in which, when the bonding is performed, in a section where thermal expansion occurs due to a difference in a thermal expansion coefficient between materials when performing a bonding process of emitting the laser beam, switching from pressure control to instantaneous position control takes place, thereby preventing a non-wet phenomenon.

A bonding device according to the present invention includes a bonding tool that presses a semiconductor chip against a substrate. With this bonding tool, a material can be prevented from being warped, and thus a uniform pitch between bumps can be maintained. The bonding tool may be a replaceable one. Thus, the bonding tool can be freely selected and installed according to a condition for a semiconductor chip. Accordingly, a pressing pressure optimized for the semiconductor chip can be realized, thereby improving banding quality. Specifically, pressure control or position control can be performed when bonding is performed under a pressing condition. In a thermal expansion section, switching from the pressure control to the position control can take place, thereby improving the bonding equality and minimizing a defect rate.

BRIEF DESCRIPTION OF THE DRAWINGS

The above and other objectives, features, and other advantages of the present invention will be more clearly understood from the following detailed description when taken in conjunction with the accompanying drawings, in which:

FIG. 1 is a view illustrating an arrangement of a bonding head and a conveyor unit of a laser compression bonding device according to the present invention;

FIG. 2 is an enlarged view illustrating a lower portion of the bonding head in FIG. 1;

FIG. 3 is an enlarged view illustrating a bottom of the lower portion of the bonding head in FIG. 2;

FIG. 4 is a block diagram for controlling a pressure applied by a bonding tool and a position thereof;

FIG. 5 is a graph illustrating a correlation among a position of the bonding head, the pressure applied by the bonding tool, and laser beam emission;

FIG. 6 is a graph illustrating a relationship among the pressure applied by the bonding tool, the position thereof, and the laser beam emission according to the present invention;

FIG. 7 is a photograph showing a state of a bonding defect in the related art;

FIG. 8 is a photograph showing a state of normal bonding according to the present invention;

FIG. 9 is a cross-section view and a plan view of an image capture path formed in the bonding tool made of quartz for a thermal imaging camera; and FIG. 10 is a view illustrating a state of a temperature of a surface of a semiconductor chip, which is monitored through a laser beam and the thermal imaging camera when the bonding tool in FIG. 9 is installed.

DETAILED DESCRIPTION OF THE INVENTION

A preferable embodiment of the present invention will be described in detail below with reference to the accompanying drawings.

FIG. 1 illustrates a schematic configuration of a laser compression bonding device according to the present invention. FIG. 2 illustrates a lower portion of the bonding head in FIG. 1 in an enlarged manner. FIG. 3 illustrates a bottom of the lower portion of the bonding head in FIG. 1 in an enlarged manner.

As illustrated, a laser compression bonding device 1 according to the present invention includes a conveyor unit 100 and a bonding head 200. The conveyor unit 100 is configured to transport a semiconductor chip (die) D and a substrates P from a pre-bonding zone 110 through a main bonding zone 120 to an unloading zone 130. The semiconductor chip D and the substrate P are received in the pre-bonding zone 110.

The bonding head 200 includes a bonding tool 210, a laser beam generator 220, a thermal imaging camera 230, and a compression unit 240. The bonding tool 210 is configured to apply a pressure to the semiconductor chip D and the substrate P. The laser beam generator 220, installed over the bonding tool 210, is configured to emit a laser beam for bonding between the semiconductor chip D and the substrate P. The laser beam passes through the bonding tool 210. The thermal imaging camera 230 is configured to measure a temperature of each of the surfaces of the semiconductor chip D and the substrate P. The compression unit 240 is configured to control a pressure applied by the bonding tool 210 and a position of the bonding tool 210.

The letter T in FIG. 1 indicates a transportation tray on which the semiconductor chips D and the substrate P are nested. The conveyor unit 100 is configured to transport the transportation tray.

According to the present invention, when bonding is performed, infrared light emitted from the semiconductor chip D passes through the bonding tool 210 and reaches the thermal imaging camera 230. Thus, the thermal imaging camera 230 precisely measures the temperature of the surface of the semiconductor chip D in real time. An area of a surface whose temperature is measured by the thermal imaging camera 230 is the same as or larger than that of a surface illuminated with the laser beam emitted by the laser beam generator 220. Accordingly, a temperature distribution and a change in temperature in a laser illumination region are precisely measured and detected, respectively, in real time. For this precise detection, the bonding tool 210 employs a configuration, as illustrated in FIGS. 9 and 10. The bonding tool 210, which is made of quartz, has a manifold block 212 in the upper portion and an attachment 214 in the lower portion. The manifold block 212 and the attachment 214 are integrated into one piece. An image capture path 216 is formed to pass through the manifold block 212 and the attachment 214 in an inclined direction in such a manner as to allow a thermal wavelength for the thermal imaging camera 230 to pass along the image capture path 216. The imaging capture path 216 is inclined at the same angle as the thermal imaging camera 230. Thus, the laser beam generator 220 emits a laser beam, and then the thermal imaging camera 230 reads a result of monitoring the temperature of each of the surfaces of the semiconductor chip D and the substrate P. When bonding is performed, the change in the temperature of each of the surfaces of the semiconductor chip D and the substrate P is read in real time, and thus intensity of the laser beam emitted by the laser beam generator 220 is adjusted, thereby controlling the temperature in real time.

A circular cross section of the image capture path 216 has such a diameter of approximately 1.5 mm that a condition is satisfied for measuring the temperature of the surface of the semiconductor chip D without the laser beam being affected by refraction and reflection when the bonding tool 210 transmits the laser beam emitted by the laser beam generator 220.

The conveyor unit 100 transports the semiconductor chips D and the substrate P from the pre-bonding zone 110 to the main bonding zone 120. The semiconductor chip D and the substrate P are heated to 150° C. by a preheating heater (not illustrated) under the conveyor unit 100, and then a bonding process is performed thereon. When the bonding process is finished, the semiconductor chips D and the substrate P are transported to the unloading zone 130.

As illustrated in FIG. 3, a vision alignment unit 250, provided on the bonding head 200, is configured to align a position of the semiconductor chip D. A Z-axis shaft vertical-movement motor 260 moves up and down a Z-axis (Z) shaft to adjust an operating position of the laser beam generator 220.

The laser beam generator 220, the thermal imaging camera 230, the vision alignment unit 250, and the Z-axis shaft vertical-movement motor 260 are well known in the art to which the present invention pertains, and therefore detailed illustrations and descriptions thereof are omitted.

According to the present embodiment, the compression unit 240, as illustrated in FIGS. 2 to 4, is configured to include a mount 241, a servo motor 242, and a load cell 243. The bonding tool 210 is detachably mounted on the mount 241. The servo motor 242 and the load cell 243 are configured to apply a pressure to the mount 241 in the Z-axis (Z) direction or control a position of the mount 241 in a finely graded manner.

According to the present embodiment, the servo motor 242 is fundamentally controlled with two target values for pressure application and positioning. When a main computer sends a target input signal, the servo amplifier 244 receives a signal of the load cell 243 from an indicator 245 and transfers the received signal to a motion board 246. The motion board 246 compares the target input signal received from the main computer and an output value of the indicator 245 with each other. Then, the servo amplifier 244 outputs a motor control electric-current and thus controls the servo motor 242 until a system pressure reaches a target pressure. The system pressure that is the same as the target pressure is stably maintained. Then, a subsequent bonding process is performed.

The reference numeral 247 indicates a micrometer for aligning the bonding tool 210 with its correct position within the mounter 241.

Whenever necessary, the laser compression bonding device according to the present invention, which is configured as described above, can perform laser bonding in a pressing state after the compression unit 240 is mounted, or can perform the laser bonding under a non-pressing condition in a state where the compression unit 240 is detached. These two solutions can be realized in one laser compression bonding device. This realization provides the advantage that an improvement in productivity is possible.

The laser bonding under the non-pressing condition is well known in the art to which the present invention pertains, and therefore a description thereof is omitted. First, control of the pressure applied by the bonding tool 210 and control of the position thereof, which have to be performed when the laser bonding is performed in the pressing state, will be described below.

That is, according to the present invention, with the control of the pressure applied by the bonding tool 210 and the control of the position thereof under the pressing condition, the semiconductor chip D and the substrate P can be prevented from being warped, and a bonding failure problem can be solved. The pressure control and the position control are described as follows.

FIG. 5 is a graph for the position control of the bonding tool 210 in a stepwise manner. Firstly, the Z-axis shaft vertical-movement motor 260 moves down the bonding tool 210 of the bonding head 200 at a high speed of approximately 10 mm/second from an initial position (a waiting position) (not illustrated) to a predetermined height H1 for lower-speed start-up (S10). At this point, the height H1 for low-speed start-up is set by inputting a value of a position with respect to a bonding stage S.

Subsequently, the servo motor 242 of the compression unit 240 moves down the bonding tool 210 at a speed of approximately 0.8 mm/second from the height H1 for low-speed start-up to a height H2 for lowest-speed start-up (S20). Then, the servo motor 242 moves down the bonding tool 210 at the lowest speed of approximately 0.23 mm/second from the height H2 for lowest-speed start-up to a height H3 for contact with the semiconductor chip D (S30). When the bonding tool 210 is moved down to the height H3 for contact with the semiconductor chip D, and presses and the load cell 243 detects that a pressure against the semiconductor chip D reaches 5 N/cm$^2$, it is determined that the bonding tool 210 is brought into contact with the semiconductor chip D. Then, when a target input value (for example, 30 N/cm$^2$) necessary for bonding at a pressure of 5 N/cm² is input, the laser beam generator 220 operates to emit a laser beam L, thereby performing bonding (S40).

When the bonding is finished, the bonding tool 210 is moved up to a height H4 for finishing a bonding operation, thereby finishing the bonding operation (S50).

According to the present invention, in the bonding step S40, the pressure applied by the bonding tool 210 or the position thereof is not simply controlled, but they are controlled in conjunction with each other. When performing a bonding process of emitting a laser beam, a section where thermal expansion occurs is established according to a thermal expansion coefficient of a material. Thus, when only the pressure control is performed continuously, pitches between bumps are caused to be different from each other, and pitches between bumps on the center and bumps on the periphery are caused to be different from each other. As illustrated in FIG. 7, these differences cause a so-called non-wet phenomenon to occur. In the thermal expansion section, in order to prevent the non-wet phenomenon, switching from pressure control to instantaneous position control takes place, and when a predetermined time elapses, returning to a target position takes place. In this manner, as illustrated in FIG. 8, control is performed in such a manner as to perform normal banding.

That is, as understood from FIG. 6, in the bonding step S40, when illuminated with a laser beam for bonding, the semiconductor chip D and the substrate P receive instantaneous energy (50 W/cm²). The semiconductor chip D is made of silicon, and the substrate P is a printed circuit board (PCB) made of thermosetting resin. Because of this, when receiving thermal energy, the semiconductor chip D and the substrate P expand instantaneously, and also in the Z-axis direction. The position control is performed in a finely graded manner in such a manner that, the moment a pressure rises up by 10% from a target input value, the bonding tool 210 is moved up to offset a proportional increase in height from a pressure-controlled height. When the bonding is finished, returning to an initial target input value takes place, and the bonding tool 210 also returns to the position from which it rose up previously.

According to the present invention, the position of the bonding tool 210 is controlled in a finely graded manner in such a manner that the semiconductor chip D is prevented from being warped due to thermal energy in a process of bonding the semiconductor chip D of size 100 micrometers or less to the substrate P by performing laser bonding, that is, in such a manner that the bonding tool 210 is moved up to offset an increase in height in the Z-axis direction due to the thermal expansion under the pressing condition while the bonding is performed in a pressure-applied state. Thus, the bonding is performed in a state where heights between bumps are uniformly maintained, thereby preventing a phenomenon where the bonding is not properly performed and where a bonding failure thus occurs. The bonding tool 210 can be attached from or mounted on the mount 241 of the compression unit 240, thereby performing the two processes under the pressing condition and under the non-pressing condition in one device. An image capture path is formed to pass through the bonding tool 210 made of quartz, and thus the bonding tool 210 transmits a laser beam and an infrared light along the image capture path therein, thereby measuring the temperature of the surface of the semiconductor chip D in real time. The advantage is provided in that the intensity of the laser beam emitted by the laser beam generator 220 is adjusted and in that the temperature is thus controlled in real time.

Although the specific embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A laser compression bonding device for a semiconductor chip, the device comprising:
   a conveyor unit configured to transport a semiconductor chip and a substrate which are received in a pre-bonding zone and on which bonding is then performed in a main bonding zone, to an unloading zone; and
   a bonding head that comprises:
     a bonding tool configured to apply a pressure to the semiconductor chip and the substrate;
     a laser beam generator installed over the bonding tool and configured to emit a laser beam for bonding between the semiconductor chip and the substrate, the laser beam passing through the bonding tool;
     a thermal imaging camera configured to measure a temperature of each of the surfaces of the semiconductor chip and the substrate;
     a compression unit configured to control a pressure applied by the bonding tool and a position thereof;
     a vision alignment unit configured to align a position of the semiconductor chip; and
     a Z-axis shaft vertical-movement motor, wherein
   the compression unit comprises:
     a mount on which the bonding tool is detachably mounted; and
     a servo motor and a load cell, which are configured to apply a pressure to the mount in the Z-axis direction or control a position thereof in a finely graded manner, and
   the servo motor is controlled with two target values for pressure application and positioning.

2. The laser compression bonding device of claim 1, wherein
   the bonding tool, which is made of quartz, has a manifold block in an upper portion thereof and an attachment in a lower portion thereof, the manifold block and the attachment being integrated into one piece,
   an image capture path is formed to pass through the bonding tool in an inclined direction in such a manner as to allow a thermal wavelength toward the thermal imaging camera to pass along the image capture path, the image capture path being inclined at the same angle as the thermal imaging camera, and
   the laser beam generator emits the laser beam and then the thermal imaging camera reads a result of monitoring the temperature of each of the surfaces of the semiconductor chip and the substrate.

3. A laser compression bonding method of bonding a semiconductor chip to a substrate using the laser compression bonding device according to claim 1, the method comprising:
   a step of enabling a Z-axis shaft vertical-movement motor to move down a bonding tool at a high speed from an initial position to a predetermined height for low-speed start-up;
   a step of enabling a servo motor of a compression unit to move down the bonding tool at a low speed from the height for low-speed start-up to a height for lowest-speed start-up;

a step of enabling the servo motor to move down the bonding tool at a lowest speed from the height for lowest-speed start-up to a height for contact with a semiconductor chip;

a step of determining that the bonding tool is brought into contact with the semiconductor chip, when the bonding tool is moved down to the height for contact with the semiconductor chip in the step and then a load cell detects that a pressure against the semiconductor chip reaches 5 N/cm$^2$, and of enabling a laser beam generator to operate to emit a laser beam, thereby performing bonding, when a target input value necessary for bonding at a pressure of 5 N/cm$^2$ is input; and a step of enabling the servo motor to move up the bonding tool to a height for finishing a bonding operation, thereby finishing the bonding operation, when the bonding is finished, wherein in the step, in a section where thermal expansion of the semiconductor chip and the substrate occurs when performing a bonding process of emitting the laser beam, the compression unit switches from pressure control to instantaneous position control, thereby preventing a non-wet phenomenon.

4. The laser compression bonding method of claim 3, wherein in the step, when an increase of 10% in pressure occurs from the target input value that is input into the compression unit, the switching to the position control takes place in such a manner that the bonding tool is moved up to offset the thermal expansion in the Z-axis direction, and when the bonding is finished, control is performed in such a manner that returning to an initial target input value takes place.

* * * * *